(12) United States Patent
Jang

(10) Patent No.: US 9,553,167 B2
(45) Date of Patent: Jan. 24, 2017

(54) SEMICONDUCTOR DEVICE AND METHOD FOR FORMING THE SAME

(71) Applicant: SK hynix Inc., Gyeonggi-do (KR)

(72) Inventor: Kyoung Chul Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/818,879

(22) Filed: Aug. 5, 2015

(65) Prior Publication Data
US 2016/0284818 A1    Sep. 29, 2016

(30) Foreign Application Priority Data

Mar. 27, 2015 (KR) .................. 10-2015-0043255

(51) Int. Cl.
| | |
|---|---|
| H01L 29/02 | (2006.01) |
| H01L 29/66 | (2006.01) |
| H01L 29/78 | (2006.01) |
| H01L 29/423 | (2006.01) |
| H01L 29/49 | (2006.01) |
| H01L 29/36 | (2006.01) |
| H01L 21/283 | (2006.01) |
| H01L 21/3215 | (2006.01) |
| H01L 21/306 | (2006.01) |

(52) U.S. Cl.
CPC ....... *H01L 29/66613* (2013.01); *H01L 21/283* (2013.01); *H01L 21/30604* (2013.01); *H01L 21/3215* (2013.01); *H01L 29/36* (2013.01); *H01L 29/4236* (2013.01); *H01L 29/4966* (2013.01); *H01L 29/78* (2013.01)

(58) Field of Classification Search
CPC .. H01L 29/66613; H01L 21/283; H01L 29/78; H01L 29/4236; H01L 21/30604; H01L 29/36; H01L 29/4966; H01L 21/3215
See application file for complete search history.

(56) References Cited

U.S. PATENT DOCUMENTS

| | | | |
|---|---|---|---|
| 2005/0079661 A1* | 4/2005 | Cho | ............... H01L 29/41758 438/197 |
| 2008/0061346 A1 | 3/2008 | Tang et al. | |
| 2009/0311845 A1 | 12/2009 | Tang et al. | |
| 2010/0044752 A1* | 2/2010 | Marui | ............... H01L 29/7787 257/192 |
| 2011/0074498 A1 | 3/2011 | Thompson et al. | |
| 2011/0171802 A1 | 7/2011 | Tang et al. | |
| 2011/0260242 A1* | 10/2011 | Jang | ............... H01L 21/265 257/331 |
| 2012/0299111 A1 | 11/2012 | Thompson et al. | |
| 2013/0020638 A1 | 1/2013 | Thompson et al. | |
| 2013/0020639 A1 | 1/2013 | Thompson et al. | |

(Continued)

FOREIGN PATENT DOCUMENTS

| | | |
|---|---|---|
| KR | 1020050063152 | 6/2005 |
| KR | 1020090040460 | 4/2009 |
| KR | 1020130004909 | 1/2013 |

*Primary Examiner* — Victor A Mandala
(74) *Attorney, Agent, or Firm* — IP & T Group LLP

(57) ABSTRACT

A semiconductor device is disclosed. The semiconductor device comprising: a semiconductor substrate having first type conductivity and including an active region and a device isolation film, a doping layer having second type conductivity and buried in a bottom part of the semiconductor substrate of the active region, a recess formed in the semiconductor substrate, a gate electrode provided in the recess.

13 Claims, 9 Drawing Sheets

(56) References Cited

U.S. PATENT DOCUMENTS

| | | | |
|---|---|---|---|
| 2014/0024191 A1* | 1/2014 | Chen | H01L 21/26586 |
| | | | 438/294 |
| 2014/0077312 A1 | 3/2014 | Thompson et al. | |
| 2014/0097489 A1* | 4/2014 | Roig-Guitart | H01L 29/0646 |
| | | | 257/330 |
| 2016/0141204 A1* | 5/2016 | Kawahara | H01L 21/76224 |
| | | | 257/330 |

* cited by examiner

SEMICONDUCTOR DEVICE AND METHOD FOR FORMING THE SAME

CROSS-REFERENCE TO RELATED APPLICATION

The priority of Korean patent application No. 10-2015-0043255 filed on 27 Mar. 2015, the disclosure of which is herein incorporated by reference in its entirety, is claimed.

BACKGROUND OF THE INVENTION

Embodiments of the present disclosure relate to a semiconductor device and a method for forming the same, and more particularly to a semiconductor device having a buried gate and a method for forming the same.

If the area occupied by unit cell is reduced, the number of unit cells per wafer increases, thereby improving productivity. Several methods for reducing the area of unit cell have been proposed. One method is to replace a conventional planar gate having a horizontal channel region with a recess gate. In the recess gate structure, a recess is formed in a substrate and a channel region is formed along a curved surface of the recess and a gate is formed in the recess. Furthermore, a buried gate has been studied which can reduce parasitic capacitance of a bit line by burying the entire gate within the recess.

FIG. 1 is a cross-sectional view illustrating a conventional semiconductor device having a buried gate. Referring to FIG. 1, device isolation film 20 defining an active region 17 is formed in a semiconductor substrate 10, and a sidewall oxide film 15 is formed at a sidewall of the device isolation film 20.

A mask pattern 18 defining a buried gate is formed over the semiconductor substrate 10, and an etching process is performed using the mask pattern 18 as an etch mask, resulting in formation of a recess 27 in the semiconductor substrate 10.

A buried gate is formed to be buried in the recess 27. The buried gate includes: a recess 27 having a predetermined depth which is formed in the active region 17 or the device isolation film 20; a gate insulation film 35 formed with a thin thickness over the recess 27; and a gate conductive film 40 buried in the bottom of the recess 27 and having the gate insulation film 35. A sealing film 45 is formed over the gate conductive film 35, such that individual buried gates are isolated from each other. Junction regions 30 are formed in the active region 17 located at both sides of the buried gate, respectively.

If data "1" is stored in a cell of the above-mentioned semiconductor device, a leakage current occurs in the cell. Specifically, Gate Induced Drain Leakage (GIDL) and junction leakage occur as shown in FIG. 1. The leakage currents flow out through an external body electrode after passing through a P-well region of the active region 17. If a voltage (Vbody) of the body electrode is set to a low absolute value, leakage current decreases and retention characteristics improve.

However, GIDL, junction leakage, and an off leakage of a transistor may coexist in a cell. In this case, if the body electrode has a low voltage, retention characteristics of the cell having both GIDL and junction leakage may improve. However, the off leakage further increases in a cell in which the off leakage of the transistor occurs, resulting in deterioration of retention characteristics.

SUMMARY OF THE INVENTION

Various embodiments of the present disclosure are directed to providing a semiconductor device and a method for forming the same that substantially obviate one or more problems due to limitations and disadvantages of the related art.

An embodiment relates to a semiconductor device which a cell having GIDL and junction leakage coexist and a method for forming the same. In the embodiment when a low voltage occurs in a body electrode, retention characteristics of the device may be improved.

In accordance with an aspect of the present disclosure, A semiconductor device comprising: a semiconductor substrate having first type conductivity and including an active region and a device isolation film, a doping layer having second type conductivity and buried in a bottom part of the semiconductor substrate of the active region, a recess formed in the semiconductor substrate, a gate electrode provided in the recess.

In accordance with another aspect of the present disclosure. A method for forming a semiconductor device comprising: forming a device isolation film defining an active region in a semiconductor substrate having first type conductivity, forming a doping layer at a bottom portion of the semiconductor substrate by implanting an impurity having second type conductivity into the active region, forming a plurality of recesses by etching the semiconductor substrate and forming gate electrodes by filling bottom portions of the recesses with conductive material.

In accordance with another aspect of the present disclosure, first and second device isolation films each formed in a substrate and located at a first level, a first active region provided between the first and the second device isolation films, a first gate formed in the first active region and located at a second level, and a doping layer extending from the first device isolation film to the active region and located at a third level, wherein the third level is lower than the second level, and wherein the third level is the same as or higher than the first level.

It is to be understood that both the foregoing general description and the following detailed description are exemplary and explanatory, and are intended to provide further description of the claims.

DETAILED DESCRIPTION

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
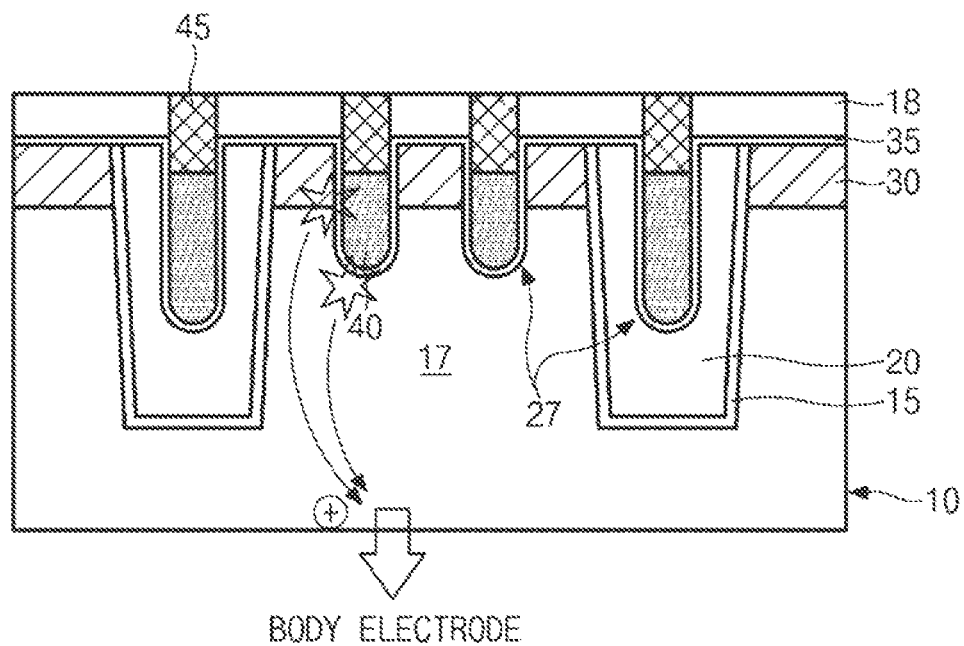
FIG. 1 is a cross-sectional view illustrating a conventional semiconductor device having a buried gate.
Figure 2:
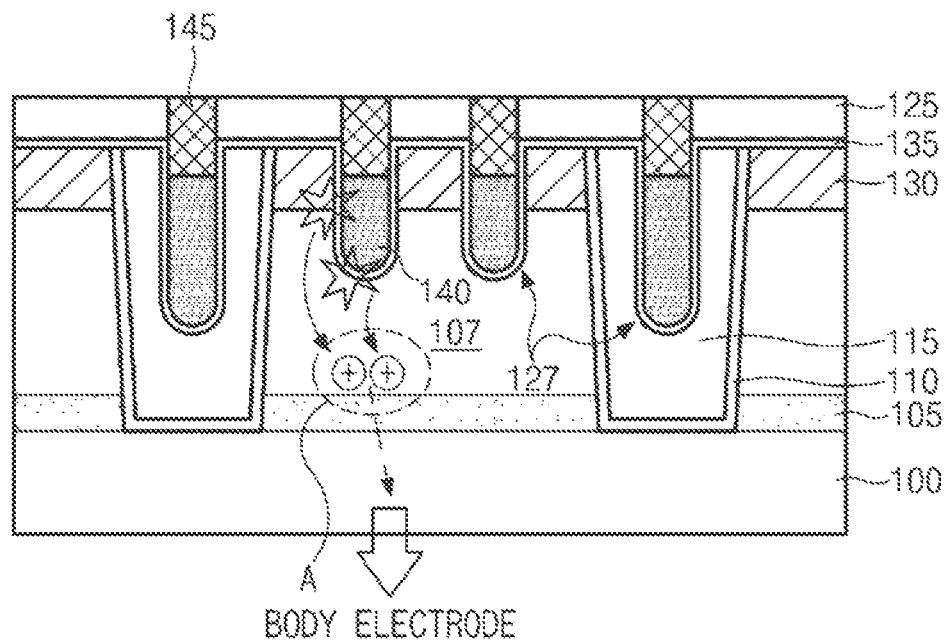
FIG. 2 is a cross-sectional view illustrating a semiconductor device according to an embodiment of the present disclosure.

FIG. 2 is a cross-sectional view illustrating a semiconductor device according to an embodiment of the present disclosure. In more detail, the semiconductor device having a buried gate according to an embodiment of the present disclosure will hereinafter be described with reference to FIG. 2.

Referring to FIG. 2, the semiconductor device according to the embodiment may include a semiconductor substrate 100 in which an active region 107 and a device isolation film 115 defining the active region 107 are formed. In an embodiment, the semiconductor substrate 100 may be a P-type semiconductor substrate. However, the semiconductor substrate 100 is not limited to the P-type semiconductor substrate.

After a trench having a predetermined depth is formed in the semiconductor substrate 100, an insulation film for device isolation is buried in the trench through a Shallow Trench Isolation (STI) method, resulting in formation of a device isolation film 115. A device isolation insulation film may be formed of a Silicon On Dielectric (SOD), a High Density Plasma (HDP), or a combination thereof. In addition, the device isolation insulation film may be formed of silicon nitride. However, the device isolation insulation film may be formed of other materials which may easily fill the device isolation trench and have good coverage characteristics.

A liner film 110 is formed over the trench before the trench is filled with the device isolation insulation film. The liner film 110 may be formed by depositing a thin thickness of a wall oxide, a liner nitride film, a liner oxide film 110, or the like.

A doping layer 105 is formed at the bottom of the active region 107 of the semiconductor substrate 100. The doping layer 105 is formed at the same level as or higher than the bottom surface of the device isolation film 115. That is, the doping layer 105 is formed to have a depth at which the doping layer 105 can be isolated by the device isolation film 115. For example, the doping layer 105 is formed in the semiconductor substrate 100 and formed to a depth of 500~5000 Å when measured from the upper surface of the semiconductor substrate 100.

Since the doping layer 105 is isolated by the device isolation film 115, a P-well region of each cell can be isolated from a neighboring P-well region. The doping layer 105 may be formed by implantation of impurities with different conductivity from the semiconductor substrate 100. For example, when the semiconductor substrate 100 is P-type material, the doping layer 105 may be formed by implantation of N-type impurity ions. N-type impurity ions may be formed of phosphorus (Ph), arsenic (As), or a combination thereof, but are not limited thereto.

Junction regions 130 serving as a source and a drain are formed at left and right sides of a gate electrode of the semiconductor substrate 100, respectively. After a mask (not shown) exposing the junction regions 130 is formed over the upper surface of the semiconductor substrate 100, ion implantation is performed, resulting in formation of the junction regions 130.

In addition, a recess 127 is formed in the semiconductor substrate 100, and a buried gate buried in the recess 127 is formed. The buried gate includes: a recess having a predetermined depth and formed in the active region 107, and the device isolation film 115; a gate insulation film 135 formed with a thin thickness and formed over the surface of the recess 127; and a gate conductive film 140 buried in the bottom of the recess 127 in which the gate insulation film 135 is formed. A sealing film 145 is formed over the gate conductive film 140 such that neighboring buried gates are isolated from each other.

The gate conductive film 140 may be formed of titanium nitride (TiN), tantalum nitride (TaN), tungsten (W), or a combination thereof. In order to reduce resistance, the gate conductive film 140 may be formed to be multi-layered. For example, a titanium nitride (TiN) film (or a tantalum nitride (TaN) film) is deposited first to a thin thickness, and a tungsten film is formed over the titanium nitride (TiN) film to gap fill the recess 127. Alternatively, the gate conductive film 140 may be formed of a stacked structure of the titanium nitride (TiN) film and the tantalum nitride (TaN) film, or may be formed of a stacked structure of the titanium nitride (TiN) film, the tantalum nitride (TaN) film, and the tungsten (W) film.

Figure 3:
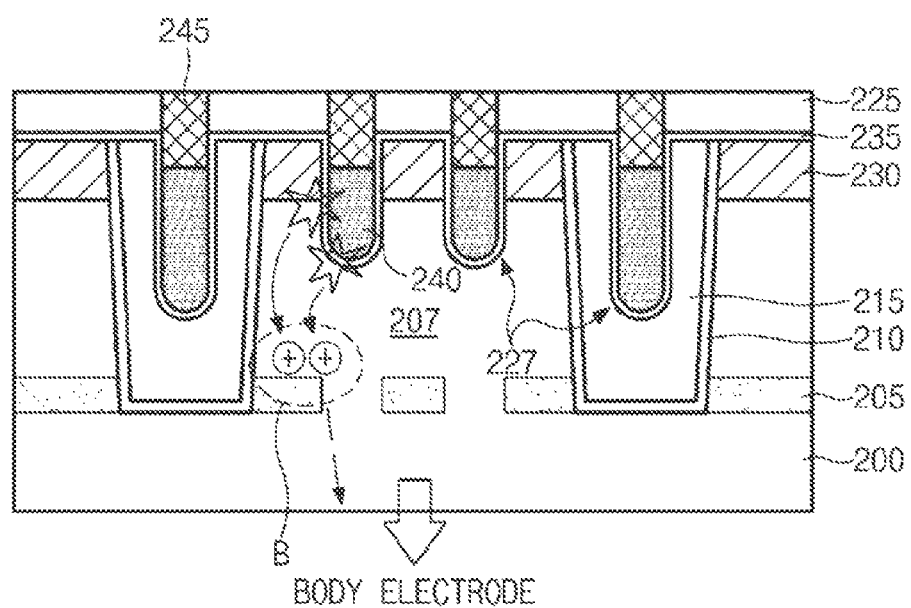
FIG. 3 is a cross-sectional view illustrating semiconductor device according to another embodiment of the present disclosure.

FIG. 3 is a cross-sectional view illustrating a semiconductor device according to another embodiment of the present disclosure. The semiconductor device according to another embodiment will hereinafter be described with reference to FIG. 3.

Referring to FIG. 3, the semiconductor device includes a semiconductor substrate 200 in which an active region 207 and a device isolation film 215 defining the active region 207 are formed.

A buried gate is formed both in the active region 207 and in the device isolation film 215 of the semiconductor substrate 200. The buried gate includes: a recess 227 having a predetermined depth and formed in the active region 207 or the device isolation film 215; a gate insulation film 235 formed with a thin thickness over the recess 227; and a gate conductive film 240 buried in the bottom of the recess 227 in which the gate insulation film 235 is formed. A sealing film 245 is formed over the gate conductive film 240 such that neighboring buried gates are isolated from each other.

A doping layer 205 is formed to a predetermined depth when measured from the top surface of the semiconductor substrate 200. The doping layer 205 may be formed by implantation of impurities with different conductivity from the semiconductor substrate. For example, when the semiconductor substrate 200 is a P-type semiconductor substrate, the doping layer 205 may be formed by implantation of N-type impurity ions.

The doping layer 205 is formed in the active region 207 of the semiconductor substrate 200 so that the doping layer 205 is isolated by the device isolation film 215. For example, the doping layer 205 may extend from the device isolation film 215 to under the gate conductive film 240. Hereinafter this doping layer 205 may be referred to as a first doping layer 205.

Another doping layer 205 may also be formed in an isolated pattern shape and extend between two neighboring gate electrodes 240 in the active region 207. Hereinafter, this doping layer 205 may be referred to as a second doping layer 205. The second doping layer 205 may be located at a level lower than bottoms of the neighboring gate electrodes 240.

The doping layer 205 may be disposed at a level deeper than the bottom surface of the device isolation film 215. That is, the doping layer 205 is formed to such a depth that two neighboring doping layers 205 can be isolated from each other by the device isolation film 215. For example, the doping layer 205 is disposed in the semiconductor substrate 100 to a depth of 500~5000 Å when measured from the upper surface of the semiconductor substrate 200.

Therefore, neighboring P-type regions of the semiconductor substrate 200 are isolated from each other.

A junction region 230 serving as a source or a drain is formed at side of a buried gate of the semiconductor substrate 100.

If data is stored in a cell of the semiconductor device shown in FIG. 2 or FIG. 3, GIDL, junction leakage, and off leakage occur in the cell. In this case, GIDL, junction leakage, and off leakage are respectively generated in different cells.

Neighboring P-well regions of the semiconductor substrate (100 or 200) are isolated from each other by unit of cell by the doping layers (105 or 205). As a result, positive (+) charges may stay within each P-well region by the doping layers (105, 205) in the cell in which GIDL and junction leakage occur as shown in the portion denoted "A" in FIG. 2 and the portion denoted "B" in FIG. 3. The doping layer 105 has low doping density so that the flow of a current is momentarily delayed rather than being permanently blocked. That is, without a change in an external body electrode voltage, the cell performs as if the body electrode voltage gradually decreases. Thus, GIDL and junction leakage can be reduced and retention characteristics can be improved.

Since the internal body electrode voltage is not changed in the cell in which off leakage of the transistor occurs, the off leakage remains unchanged and thus deterioration of retention characteristics can be prevented.

As described above, with respect to an on-state cell in which GIDL and junction leakage occur, the doping layer 105, 205 contributes to an effect that the body electrode voltage lowers, thereby improving retention characteristics of the semiconductor device. In addition, with respect to an off-state cell in which off current may occur, the doping layer 105, 205 has no effect to the body electrode voltage, thereby keeping the off current at a low level.

Figure 4A:
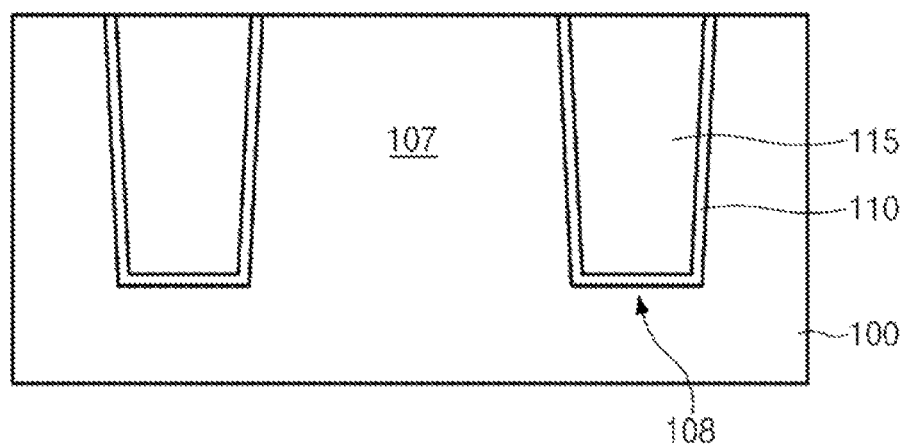
FIGS. 4A to 4D are cross-sectional views illustrating a method for forming a semiconductor device according to an embodiment of the present disclosure.

FIGS. 4A to 4D are cross-sectional views illustrating a method for forming a semiconductor device according to an embodiment of the present disclosure. Referring to FIG. 4A, a device isolation trench 108 defining the active region 107 is formed by etching a semiconductor substrate 100.

A liner film 110 is formed over an entire surface including the device isolation trench 108. The liner film 110 may be formed by sequentially depositing a liner oxide film and a liner nitride film.

The liner oxide film may be formed to increase adhesiveness with the liner nitride film. The liner nitride film does not contract during the annealing process, so that the liner nitride film can prevent distortion of the semiconductor substrate 100 or the like. In addition, the liner nitride film may serve to absorb stress generated by a difference in thermal expansion coefficient between the liner nitride film and an insulation film filling in the device isolation trench 108.

Thereafter, the device isolation insulation film is formed over an entire upper surface and filling in the device isolation trench 108 in which the liner oxide film and the liner nitride film are formed. The device isolation insulation film may be formed of Silicon On Dielectric (SOD), High Density Plasma (HDP), or a combination thereof. In addition, the device isolation insulation film may be formed of silicon nitride material. In another embodiment, the device isolation insulation film may also be formed of other materials capable of easily filling in the device isolation trench in such a manner that no void occurs in the device isolation trench.

Subsequently, a planarization process such as, a CMP process is performed until the semiconductor substrate 100 is exposed to form a device isolation film 115 defining the active region 107.

Figure 4B:
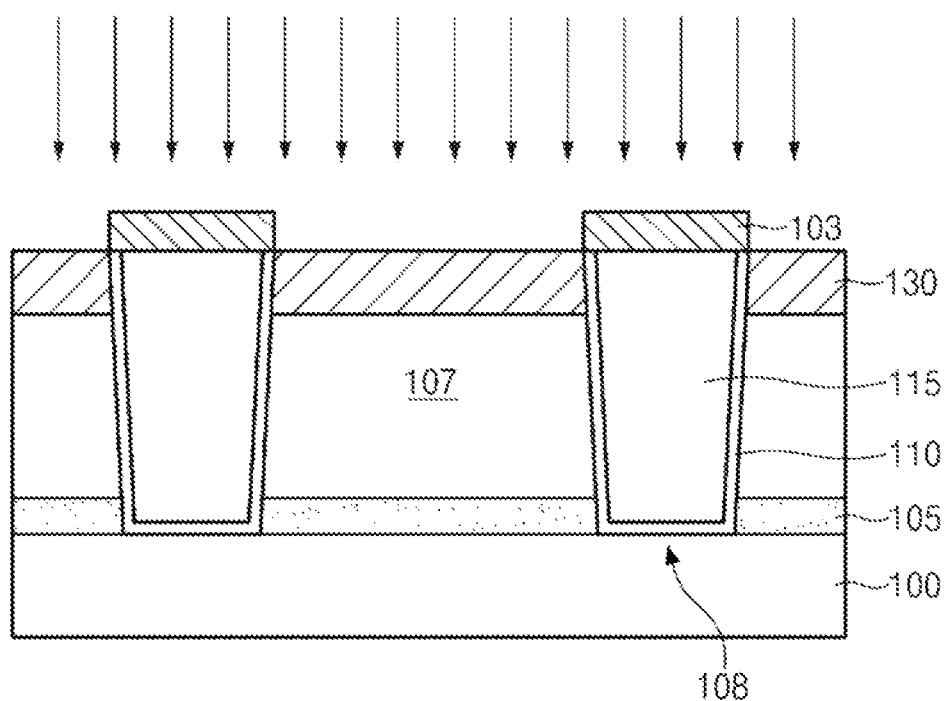

Referring to FIG. 4B, a first mask pattern 103 exposing the active region 107 is formed over the semiconductor substrate 100. Ions are implanted into the semiconductor substrate 100 in which a first mask pattern 103 is formed such that the doping layer 105 is formed to a predetermined depth in the semiconductor substrate 100. In an embodiment, the semiconductor substrate 100 may be a P-type semiconductor substrate 100.

The doping layer 105 may be formed by implantation of impurities with different conductivity from the semiconductor substrate. When the semiconductor substrate 100 has P-type conductivity, the doping layer 105 may be formed by implantation of N-type impurity ions. N-type impurity ions may include phosphorus (Ph), arsenic (As), or a combination thereof, but are not limited thereto.

The doping layer 105 may be formed at a level higher than the bottom surface of the device isolation film 115 so that neighboring doping layers 105 can be isolated from each other by the device isolation film 115. For example, the doping layer 105 may be formed to a depth of 500~5000 Å when measured from the upper surface of the semiconductor substrate 100. In this case, low-density ion implantation may be performed in the doping layer 105 in such a manner that the doping layer 105 does not fully block the flow of current. Instead, the lightly doped doping layer 105 may momentarily delay the flow of current. For example, the doping layer 105 may have an impurity density of 1E12~5E13.

Neighboring doping layers 105 are isolated from each other by the device isolation film 115 so that neighboring P-well regions, each of which serves as the active region 107, are separately isolated from each other. Since the P-well regions are isolated from each other by unit of cell. The on-state cell has GIDL and junction leakage. The doping layer 105 may cause such an effect that a voltage applied to the body electrode lowers. In an embodiment, the doping layer 105 is formed at a level the same as or higher than the bottom of the device isolation film 115. However, embodiments are not limited thereto. The fabrication order also is not limited to the process shown in FIGS. 4A-4B. Although not shown in the drawings, after the doping layer 105 is formed in the overall semiconductor substrate 100 prior to formation of the device isolation film 115, an etching process for forming the device isolation film 115 is performed so that the doping layers 105 can be isolated from each other.

Thereafter, a junction region 130 is formed over the active region 107 of the semiconductor substrate 100 through an additional ion implantation process. A first mask pattern 103 used for ion implantation is then removed. The order of an ion implantation process for forming the doping layer 105 of the semiconductor substrate 100 and an ion implantation process for forming the junction region 130 may be switched as necessary.

Figure 4C:
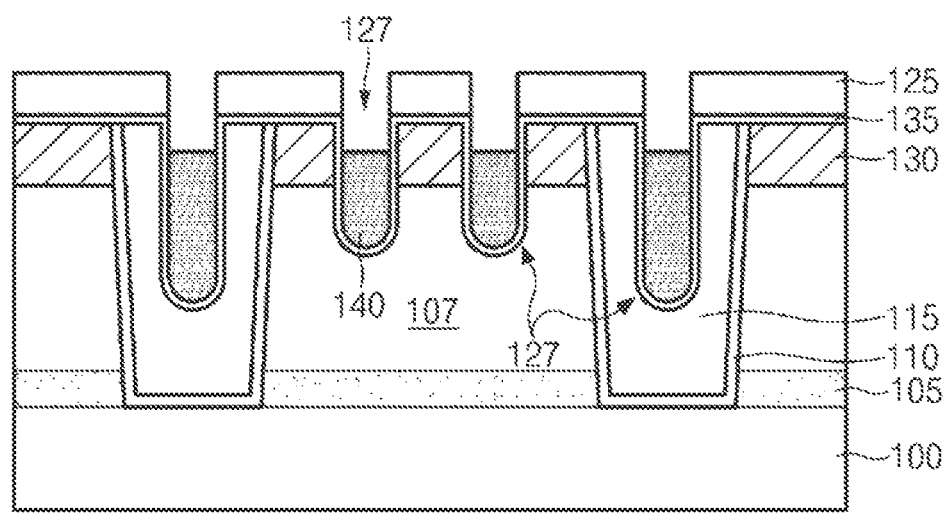

Referring to FIG. 4C, a second mask pattern 125 defining a buried gate is formed over the semiconductor substrate 100. The active region 107 and the device isolation film 115 of the semiconductor substrate 100 are etched using the second mask pattern 125 as an etch mask, resulting in formation of a plurality of recesses 127 for forming the buried gate. In this case, the junction region 130 formed over the active region 107 is also etched.

Typically, the buried gate is formed in a line shape crossing the active region 107, so that the active region 107 and the device isolation film 115 are simultaneously etched, resulting in formation of plural line-shaped recesses. In this case, the recess 127 formed in the device isolation film 115 is more deeply etched than the recess 127 formed in the active region 107 due to a difference in etch selection ratio. Accordingly, the recess 127 may be formed in a fin shape in which the bottom of the recess 127 formed in the active region 107 is located at a level higher than the bottom of the recess 127 formed in the device isolation film 115.

A gate insulation film 135 is formed in the recess 127 through an oxidation process. The gate insulation film 135 may be formed by thermal oxidation.

In addition, the gate insulation film 135 may be formed by Chemical Vapor Deposition (CVD) or Atomic Layer Deposition (ALD). The gate insulation film 135 may be formed of high dielectric material, oxide material, oxide nitride material, or a combination thereof. The high dielectric material may be an insulation material having a higher dielectric constant than those of the oxide and nitride materials. For example, the high dielectric material may include a metal oxide material, for example, hafnium oxide or aluminum oxide.

The gate conductive film may be formed of titanium nitride (TiN), tantalum nitride (TaN), tungsten (W), tungsten nitride (WN), or a combination thereof. To reduce resistance, a titanium nitride (TiN) film or a tantalum nitride (TaN) film, is deposited to a thin thickness, and a tungsten (W) film is gap filled, resulting in formation of the gate conductive film. Alternatively, the gate conductive film may be formed of a stacked structure of the titanium nitride (TiN) film and the tantalum nitride (TaN) film, or may be formed of a stacked structure of the titanium nitride (TiN) film, the tantalum nitride (TaN) film, and the tungsten (W) film.

Thereafter, a gate conductive film 140 is formed over an entire upper surface of the semiconductor substrate 100 having the recess 127 in which the gate insulation film 135 is formed. In addition, after completion of the etch-back process, the gate conductive film 140 remains only in a lower portion of the recess 127.

Figure 4D:
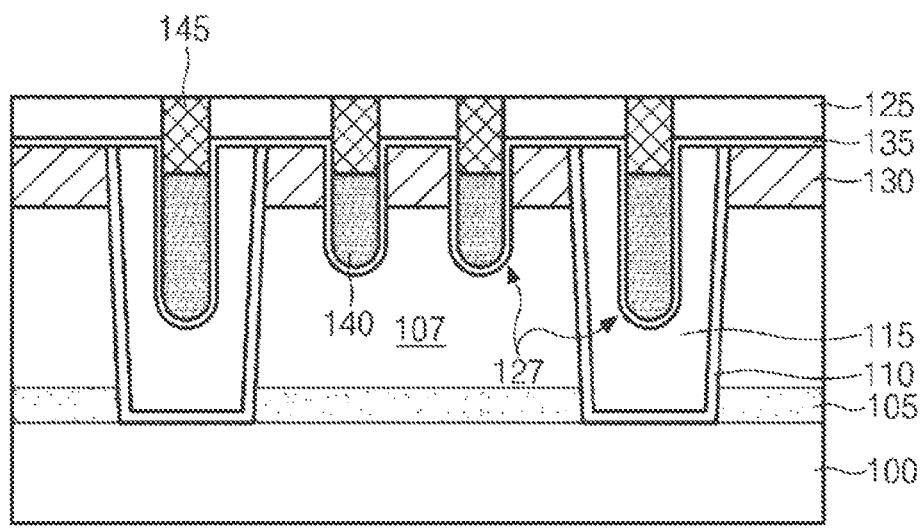

Referring to FIG. 4D, a sealing film 145 is formed over an entire upper surface of the semiconductor substrate 100 having the recess 127 in which the gate conductive film 140 is formed. The sealing film 145 may be formed of a nitride film. Thereafter, a planarization process such as, a CMP process is performed until the mask pattern 125 is exposed, resulting in formation of each isolated buried gate.

If data is stored in a cell of the semiconductor device shown in FIG. 4D, GIDL and junction leakage may occur in an on-state cell or a selected cell, and off leakage may occur in an off-state cell or a unselected cell.

Figure 5A:
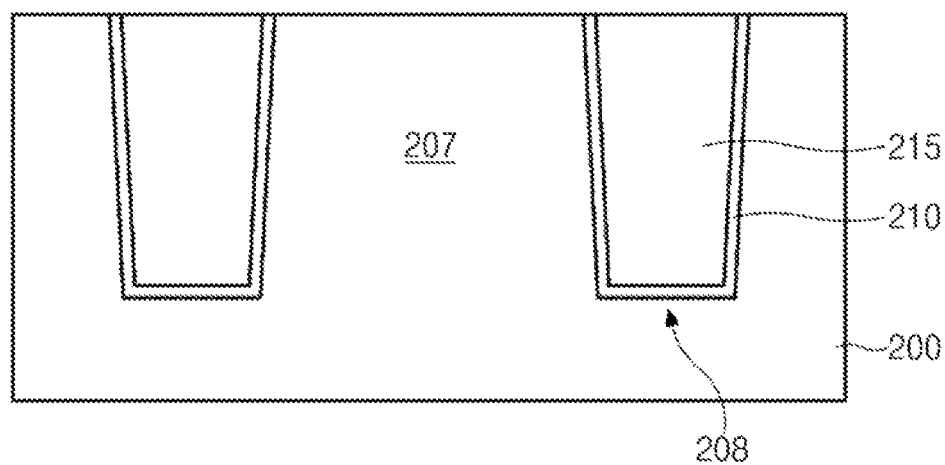
FIGS. 5A and 5B are cross-sectional views illustrating a method for forming a semiconductor device according to another embodiment of the present disclosure.
Figure 5B:
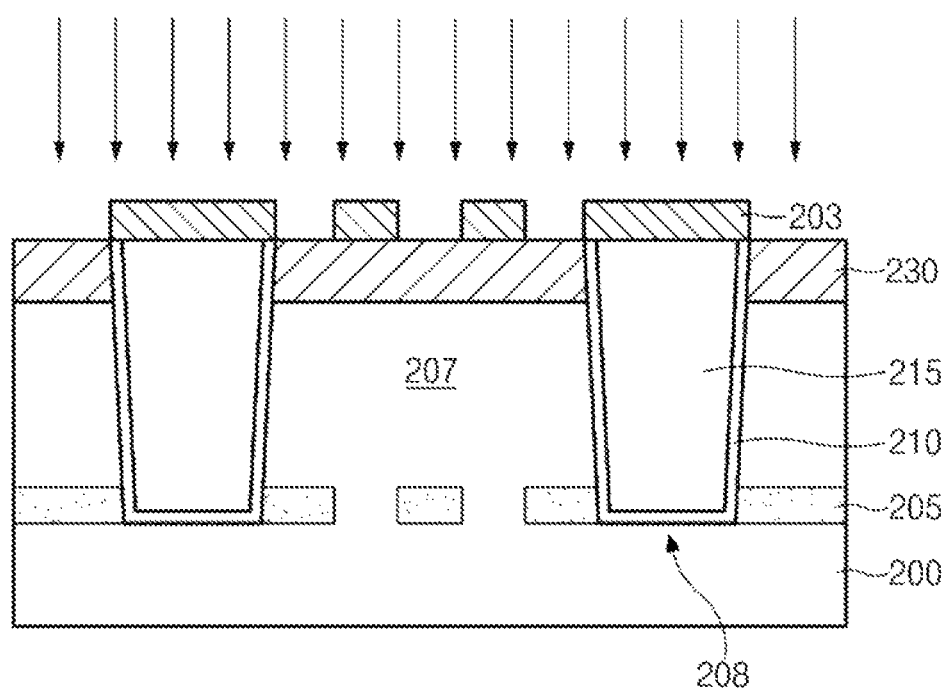

FIGS. 5A and 5B are cross-sectional views illustrating a method for forming a semiconductor device according to another embodiment of the present disclosure.

Referring to FIGS. 5A and 5B, the semiconductor substrate 200 is etched so that a device isolation trench 208 defining the active region 207 is formed.

A liner film 210 is formed over an entire surface including the device isolation trench 208. The liner film 210 may be formed by sequentially depositing a liner oxide film and a liner nitride film.

The liner oxide film may increase adhesiveness to a liner nitride film which is formed in a subsequent process. The liner nitride film does not contract during a subsequent annealing process. Thus, the liner nitride film can prevent the semiconductor substrate 200 from distortion. In addition, the liner nitride film may absorb stress generated by a difference in thermal expansion coefficient between the liner nitride film and the insulation film buried in the device isolation trench 208.

Thereafter, a device isolation insulation film is formed over an entire upper surface including the device isolation trench 208 in which the liner oxide film and the liner nitride film are formed. The device isolation insulation film may be formed of a Silicon On Dielectric (SOD), a High Density Plasma (HDP), or a combination thereof. In addition, the device isolation insulation film may be formed of silicon nitride materials. However, any material can be employed which are capable of easily filling in the device isolation trench in such a manner that no void remains in the device isolation trench.

Subsequently, a planarization process such as, a CMP process is performed until the semiconductor substrate 200 is exposed to form a device isolation film 215 defining the active region 207.

Referring to FIG. 5B, a first mask pattern 203 is formed over the device isolation film 215 of the semiconductor substrate 100 and over a region which is reserved for a gate.

Ions are implanted into the semiconductor substrate 200 in which the first mask pattern 203 is formed to form the doping layer 205 to a predetermined depth in the semiconductor substrate 200. In an embodiment, the semiconductor substrate 200 may be a P-type semiconductor substrate. The doping layer 205 may be formed by implantation of impurities with different conductivity from the semiconductor substrate. For example, when the semiconductor substrate 200 has P-type conductivity, the doping layer 205 may be formed by implantation of N-type impurity, N-type impurity may include phosphorus (Ph), arsenic (As), or a combination thereof, but is not limited thereto.

The doping layer 205 may be formed at a same level as or higher than the bottom surface of the device isolation film 215. The doping layer 205 includes (i) a first doping layer 205 extending form the device isolation film 215 to under the device isolation trench 208 in the active region 207 and (ii) a second doping layer 205 provided in the middle of the active region. Two neighboring first doping layers 205 can be isolated from each other by the device isolation film 215. For example, the doping layer 205 may be formed to a depth of 500~5000 Å when measured from the upper surface of the semiconductor substrate 200. In this case, low-density ion implantation may be performed in the doping layer 205 in such a manner that the doping layer 205 does not fully block the flow of current. Instead, the doping layer 205 may be doped to such a degree capable of momentarily delaying the flow of current. For example, ion implantation having a density of 1E12~5E13 may be performed in the doping layer 205.

The neighboring first doping layers 205, which are formed in different active regions from each other, are isolated from each other by the device isolation film 215. The second doping layer 205 is disposed under the region which is reserved for the gate. Since the P-well regions are isolated from each other by unit of cell, the first doping layer 205 may cause an effect that a voltage of the body electrode in the on-state cell or a selected cell lowers, thereby reducing GIDL and junction leakage, while causing no effect to a voltage of the body electrode in the off-state cell or a unselected cell, thereby maintaining the off leakage at a low level.

Subsequent processes are substantially the same as shown in FIGS. 4C and 4D, and a detailed description thereof will herein be omitted for convenience. As a result, the semiconductor device shown in FIG. 3 can be formed. In accordance with the present disclosure, P-well regions of the semiconductor substrate 200 are isolated by unit of cell by the doping layer 105 so that individual P-cell regions may be manipulated independently from neighboring P-cell regions. Due to the doping layer 105, positive (+) charges may momentarily stay in each P-well region by the doping layer 205 in an on-state cell in which GIDL and junction leakage occur. See the portion denoted "B" in FIG. 3. Thus, an effect is obtained that a voltage of the body electrode in the on-state cell or a selected cell lowers, thereby reducing GIDL and junction leakage of the on-state cell.

In this case, the doping layer 205 has low doping density so that the flow of a current is momentarily delayed rather than being fully blocked. Due to the doping layer 105, although an external body electrode voltage is not actually changed, an effect is obtained that the body electrode voltage of the on-state cell is virtually lowered, so that GIDL and junction leakage can be reduced and retention characteristics can be improved.

In contrast, since the body electrode voltage is not actually changed in the off-state cell or the unselected cell in which off leakage occurs, the off leakage in the off-state cell remains unchanged and deterioration of retention characteristics can be prevented.

As described above, the embodiment causes an effect that the voltage applied to the body electrode in the on-state cell is virtually lowered. Since the off-state cell is isolated from the on-state cell due to the doping layer 105, the off-state cell is not affected by application of voltage to the on-state cell. Thus, retention characteristics in the off-state cell can be maintained without deterioration.

As is apparent from the above description, an N-type doping layer is formed in the bottom of a semiconductor substrate, so that a P-well region of an on-state cell in which GIDL and junction leakage occur can be isolated from a P-well region of an off-state cell in which off leakage occurs.

Therefore, the on-state cell having GIDL and junction leakage has an effect that a voltage of the body electrode is virtually lowered, so that GIDL and junction leakage of the on-state cell decrease.

In addition, since an internal body-electrode voltage is not changed in an off-state cell having an off leakage of a transistor, the off leakage remains unchanged in the off-state cell, such that deterioration of retention characteristics can be prevented.

The above embodiments of the present disclosure are illustrative and not limitative. The invention is not limited by the type of deposition, etching polishing, and patterning steps described herein. Nor are embodiments limited to any specific type of semiconductor devices. For example, embodiments may be implemented in a dynamic random access memory (DRAM) device or non-volatile memory device.

What is claimed is:

1. A semiconductor device comprising:
   a semiconductor substrate having first type conductivity and including an active region and a device isolation film;
   a doping layer having second type conductivity and buried in a bottom part of the semiconductor substrate of the active region;
   a recess formed in the semiconductor substrate;
   a gate electrode provided in the recess; and
   a sealing film formed over the gate electrode and filled in the recess.

2. The semiconductor device according to claim 1, wherein the first type conductivity is opposite to the second type conductivity.

3. The semiconductor device according to claim 1, wherein the first type conductivity is P-type conductivity, and
   wherein the second type conductivity is N-type conductivity.

4. The semiconductor device according to claim 1, wherein the doping layer is arranged in a line shape or in a pattern shape.

5. The semiconductor device according to claim 4, wherein the doping layer in the pattern shape is isolated from a lower part of the buried gate.

6. The semiconductor device according to claim 1, wherein the doping layer is formed at a same level as or higher than a bottom surface of the device isolation film.

7. The semiconductor device according to claim 1, wherein the doping layer includes, as an impurity, phosphorus (Ph), arsenic (As), and a combination thereof and has a doping density of 1E12~5E13.

8. The semiconductor device according to claim 1, wherein the gate electrode includes titanium nitride (TiN), tantalum nitride (TaN), titanium (Ti), tantalum (Ta), molybdenum (Mo), aluminum (Al), tungsten (W), or a combination thereof.

9. The semiconductor device according to claim 1, further comprising:
   a junction region formed in the semiconductor substrate and disposed at a side of the gate electrode.

10. A semiconductor device comprising:
    first and second device isolation films each formed in a substrate and located at a first level;
    a first active region provided between the first and the second device isolation films;
    a recess formed in the active region;
    a first gate formed in recess and located at a second level;
    a doping layer extending from the first device isolation film to the active region and located at a third level; and
    a sealing film formed over the first gate and filled in the recess,
    wherein the third level is lower than the second level, and
    wherein the third level is the same as or higher than the first level.

11. The semiconductor device of claim 10,
    wherein the doping layer further extends to the second device isolation film.

12. The semiconductor device of claim 10, further comprising:
    a second doping layer provided in the in the middle of the first active region and located at a fourth level,
    wherein the fourth level is lower than the second level, and
    wherein the fourth level is the same as or higher than the first level.

13. The semiconductor device of claim 10,
    wherein the doping layer has different conductivity from the first active region.

* * * * *